United States Patent
Hoshi et al.

(10) Patent No.: US 11,594,422 B2
(45) Date of Patent: Feb. 28, 2023

(54) FILM ETCHING METHOD FOR ETCHING FILM

(71) Applicant: TOKYO ELECTRON LIMITED, Tokyo (JP)

(72) Inventors: Takayuki Hoshi, Miyagi (JP);
Masanobu Honda, Miyagi (JP);
Masahiro Tabata, Miyagi (JP); Toru Hisamatsu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/409,645

(22) Filed: Aug. 23, 2021

(65) Prior Publication Data
US 2021/0384039 A1 Dec. 9, 2021

Related U.S. Application Data

(63) Continuation of application No. 16/746,106, filed on Jan. 17, 2020, now Pat. No. 11,127,598.

(30) Foreign Application Priority Data

Jan. 18, 2019 (JP) .............................. JP2019-007137

(51) Int. Cl.
*H01L 21/311* (2006.01)
*H01J 37/32* (2006.01)

(52) U.S. Cl.
CPC .. *H01L 21/31116* (2013.01); *H01L 21/31144* (2013.01)

(58) Field of Classification Search
None
See application file for complete search history.

(56) References Cited

U.S. PATENT DOCUMENTS

| 6,235,643 | B1 | 5/2001 | Mui |
| 6,617,253 | B1 | 9/2003 | Chu |
| 8,187,486 | B1 | 5/2012 | Liu et al. |
| 9,396,962 | B2 | 7/2016 | Kitagaito |
| 10,319,613 | B2 | 6/2019 | Tabata |
| 2004/0072443 | A1* | 4/2004 | Huang .............. H01L 21/76808 257/E21.252 |
| 2012/0225557 | A1 | 9/2012 | Serry |
| 2015/0200109 | A1* | 7/2015 | Kong ................ H01L 21/32139 118/723 R |
| 2015/0371869 | A1 | 12/2015 | Surla |
| 2016/0379834 | A1* | 12/2016 | Katsu ................ H01J 37/32642 438/720 |
| 2017/0117118 | A1 | 4/2017 | Toh |

FOREIGN PATENT DOCUMENTS

| JP | 2008-060566 A | 3/2008 |
| JP | 2015-173240 A | 10/2015 |
| JP | 2017-011127 A | 1/2017 |
| JP | 2018-098480 A | 6/2018 |
| JP | 2018-190955 A | 11/2018 |

* cited by examiner

*Primary Examiner* — Shamim Ahmed
(74) *Attorney, Agent, or Firm* — Weihrouch IP

(57) ABSTRACT

An etching method includes a step of selectively forming deposit on a top surface of a mask disposed on a film of a substrate, a step of etching the film after the step of forming the deposit, a step of forming a layer of chemical species included in plasma of a processing gas, on the substrate, and a step of supplying ions from plasma of an inert gas to the substrate so that the chemical species react with the film.

12 Claims, 11 Drawing Sheets

FILM ETCHING METHOD FOR ETCHING FILM

CROSS-REFERENCE TO RELATED APPLICATIONS

This application is a continuation application of U.S. application Ser. No. 16/746,106, filed on Jan. 17, 2020, which claims priority from Japanese Patent Application No. 2019-007137, filed on Jan. 18, 2019, all of which are incorporated herein in their entireties by reference.

TECHNICAL FIELD

The present disclosure relates to a film etching method.

BACKGROUND

In manufacturing electronic devices, a film on a substrate is etched. A mask is placed on the film of the substrate for an etching process and a pattern of the mask is transferred to the film by the etching. The etching may be performed by using a plasma processing apparatus as described in, for example, Japanese Patent Laid-Open Publication No. 2015-173240 or No. 2018-098480.

SUMMARY

In an embodiment, a method of etching a film of a substrate is provided. The method includes a step of providing the substrate that has the film and a mask on the film. The method further includes a step of selectively forming a deposit on a top surface of the mask. The method further includes a step of etching the film after the step of forming the deposit. The etching step includes a step of forming, on the substrate, a layer of chemical species included in plasma of a processing gas. The etching step further includes a step of supplying ions from plasma of an inert gas to the substrate, thereby causing the chemical species and the film to react with each other.

The foregoing summary is illustrative only and is not intended to be in any way limiting. In addition to the illustrative aspects, embodiments, and features described above, further aspects, embodiments, and features will become apparent by reference to the accompanying drawings and the following detailed description.

DETAILED DESCRIPTION

Figure 1:
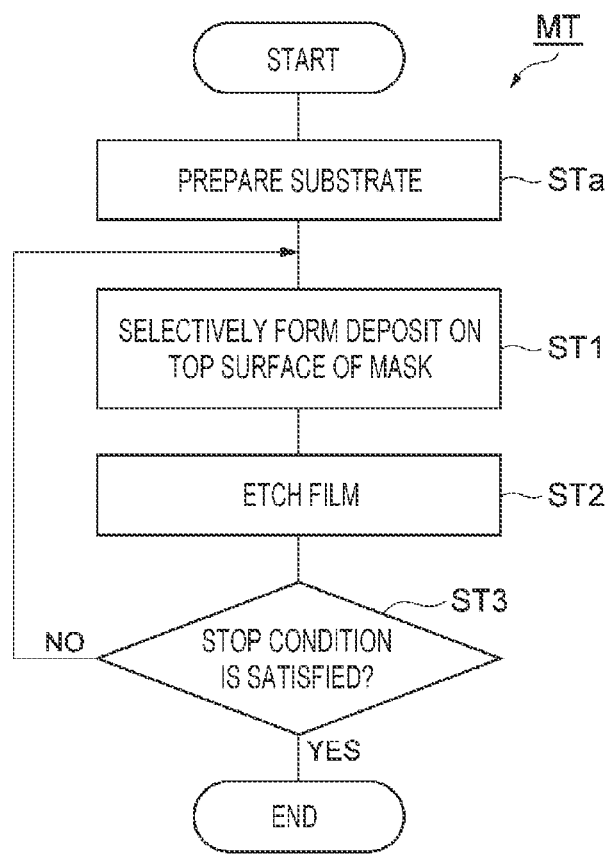
FIG. 1 is a flow chart of a method according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

In an embodiment, a method of etching a film of a substrate is provided. The method includes a step of preparing the substrate that has the film and a mask on the film. The method further includes a step of selectively forming a deposit on a top surface of the mask. The method further includes a step of etching the film after the step of forming the deposit. The etching step includes a step of forming, on the substrate, a layer of chemical species included in plasma of a processing gas. The etching step further includes a step of supplying ions from plasma of an inert gas to the substrate, thereby causing the chemical species and the film to react with each other. According to this embodiment, due to the deposit selectively formed on the top surface of the mask, the mask is protected during etching of the film. Therefore, the film thickness of the mask is suppressed from being decreased due to etching of the film. Since the deposit is selectively formed on the top surface of the mask, the etching efficiency of the film is suppressed from being lowered due to the deposit.

In the embodiment, the film of the substrate may be a silicon-containing film. The processing gas may contain a halogen element and carbon. In the embodiment, the inert gas may contain a rare gas.

In another embodiment, a method of etching a film of a substrate is provided. The method includes a step of preparing the substrate that has the film and a mask on the film. The method includes a step of selectively forming a deposit on a top surface of the mask. The method includes a step of etching the film after the step of forming the deposit. The etching step includes a step of modifying at least a part of the film that includes an exposed surface of the film by ions from plasma of a first processing gas. In the modifying step, a modified region is formed from the at least a part of the film. The etching step further includes a step of selectively etching the modified region by chemical species from plasma of a second processing gas. According to this embodiment, due to the deposit selectively formed on the top surface of the mask, the mask is protected during etching of the film. Therefore, the film thickness of the mask is suppressed from being decreased due to etching of the film. Since the deposit is selectively formed on the top surface of the mask, the etching efficiency of the film is suppressed from being lowered due to the deposit.

In the embodiment, the film of the substrate may be a silicon nitride film in this embodiment, the first processing gas may contain a hydrogen-containing gas, and the second processing gas may contain a fluorine-containing gas and a hydrogen gas.

In the embodiment, the film of the substrate may be a silicon carbide film. In this embodiment, the first processing gas may contain a nitrogen-containing gas, and the second processing gas may contain a fluorine-containing gas and a hydrogen gas.

In the embodiment, a thickness of the deposit may be set such that the ions from the plasma of the first processing gas do not reach the mask by passing through the deposit.

In the embodiment, the step of forming the deposit may be performed in a state where the substrate is accommodated within a chamber of a plasma processing apparatus. In the step of forming the deposit, plasma of a mixed gas containing a hydrocarbon gas and an adjusting gas that adjusts an amount of the deposit may be formed within the chamber. In this embodiment, the deposit containing carbon included in the plasma of the mixed gas may be formed on the top surface of the mask.

In the embodiment, the step of forming the deposit may be performed in a state where the substrate is accommodated within a chamber of a plasma processing apparatus. The step of forming the deposit may include a step of supplying a mixed gas containing a silicon-containing gas and an adjusting gas that adjusts an amount of the deposit into the chamber. The step of forming the deposit may further include a step of supplying the adjusting gas into the chamber. The step of supplying the mixed gas and the step of supplying the adjusting gas may be alternately repeated. A radio-frequency power may be supplied in order to generate plasma from the mixed gas within the chamber during execution of the step of supplying the mixed gas, and to generate plasma from the adjusting gas within the chamber during execution of the step of supplying the adjusting gas.

In the embodiment, the plasma processing apparatus includes the chamber, a substrate holder, an upper electrode, a first radio-frequency power supply, and a second radio-frequency power supply. The substrate holder includes a lower electrode and is configured to support the substrate within the chamber. The upper electrode is provided above the substrate holder through a space within the chamber. The first radio-frequency power supply is electrically connected to the upper electrode and is configured to generate a first radio-frequency power. The second radio-frequency power supply is electrically connected to the lower electrode and is configured to generate a second radio-frequency power having a frequency lower than a frequency of the first radio-frequency power.

Hereinafter, various embodiments will be described in detail with reference to drawings. In the drawings, the same or corresponding portions are denoted by the same reference numerals.

Figure 2:
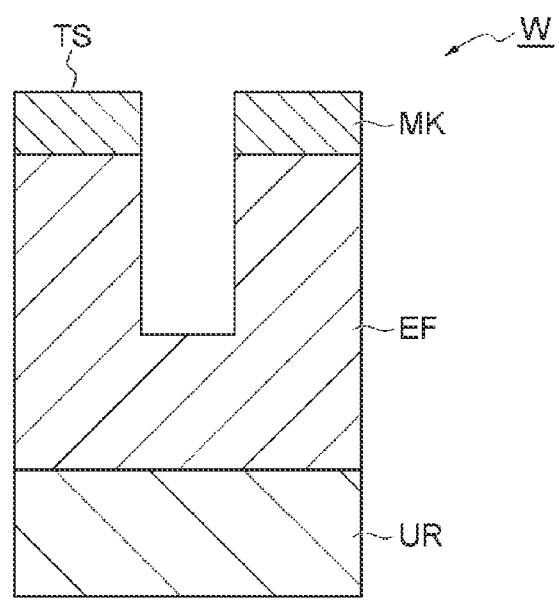
FIG. 2 is a sectional view of a part of a substrate as an example, in an enlarged scale.

FIG. 1 is a flow chart of a method according to an embodiment. A method MT illustrated in FIG. 1 is executed for etching a film of a substrate. The method MT may include step STa. In the step STa, the substrate is prepared. FIG. 2 is a sectional view of a part of the substrate as an example, in an enlarged scale. The method MT may be applied to a substrate W as an example illustrated in FIG. 2. The substrate W includes a film EF and a mask MK. The substrate W may further include a base region UR. The film EF is provided on the base region UR. The film EF may be a silicon-containing film. The film EF may be, for example, a silicon oxide film, a silicon nitride film, or a silicon carbide film.

The mask MK is provided on the film EF. The mask MK is patterned. That is, the mask MK provides one or more openings. The mask MK is made of a material different from the material of the film EF. The mask MK may be formed of a silicon-containing film, air organic film or a metal-containing film. The silicon-containing film may be made of silicon, silicon oxide or silicon nitride. The organic film may be made of amorphous carbon or a photoresist material. The metal-containing film may be made of titanium, tantalum, tungsten, or a nitride or an oxide of any of these metals.

In the embodiment, an opening continuous from the opening of the mask MK may be formed in the film EF. The opening of the film EF may be formed through, for example, plasma etching.

Figure 3:
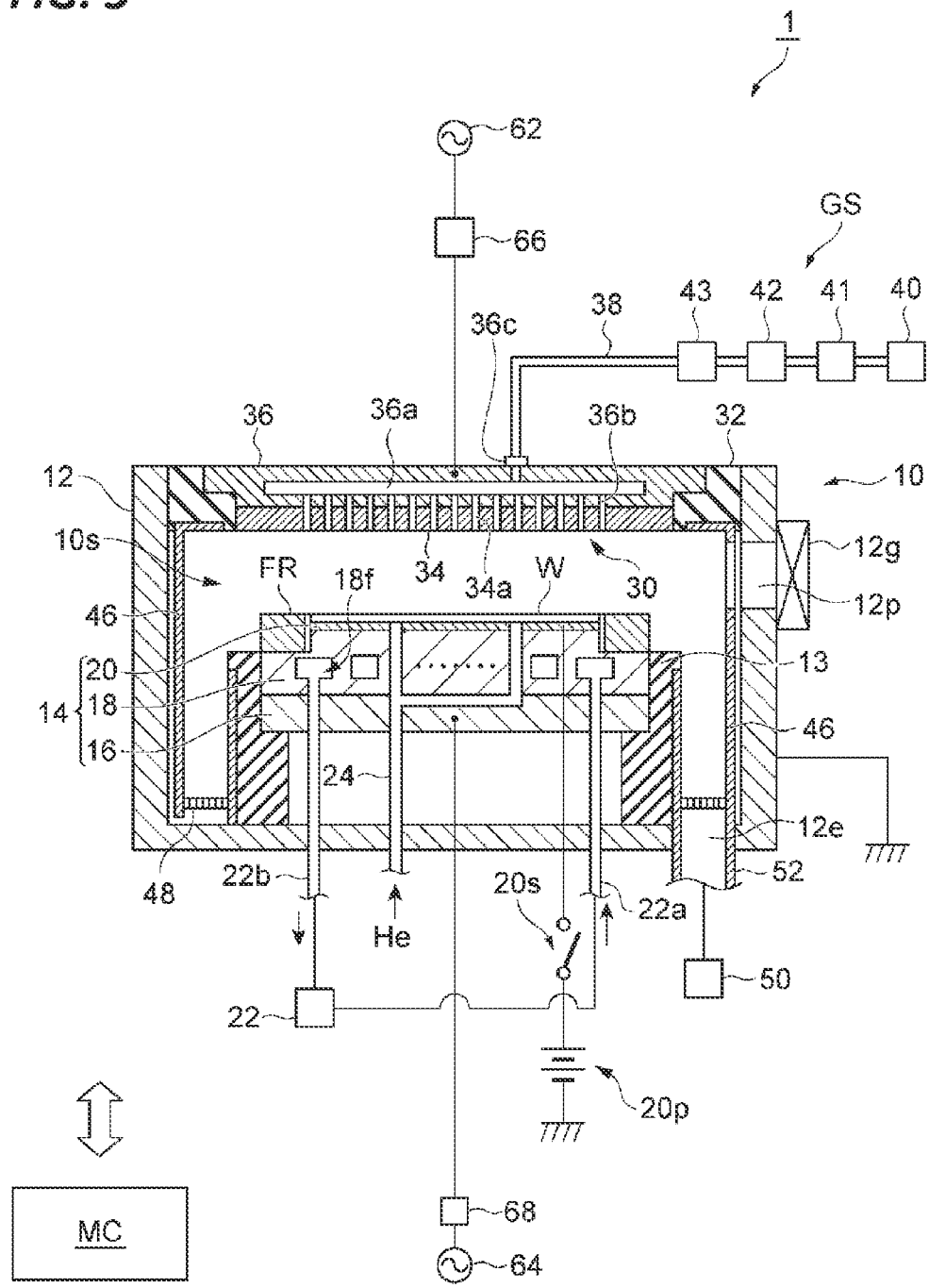
FIG. 3 is a view schematically illustrating a plasma processing apparatus as an example that may be used for executing the method illustrated in FIG. 1.

In the embodiment, a single plasma processing apparatus may be used for executing the method MT. FIG. 3 is a view schematically illustrating a plasma processing apparatus as an example that may be used for executing the method illustrated in FIG. 1. A plasma processing apparatus 1 illustrated in FIG. 3 is a capacitively coupled plasma processing apparatus. The plasma processing apparatus 1 includes a chamber 10. The chamber 10 provides an internal space 10s therein.

The chamber 10 includes a chamber body 12. The chamber body 12 has a substantially cylindrical shape. The internal space 10s is provided inside the chamber bods 12. The chamber body 12 is made of conductor such as aluminum. The chamber body 12 is grounded. A corrosion resistant film is formed on the inner wall surface of the chamber body 12. The corrosion resistant film may be a film made of ceramic such as aluminum oxide or yttrium oxide.

A passage 12p is formed in a side wall of the chamber body 12. The substrate W passes through the passage 12p when transferred between the internal space 10s and the outside of the chamber 10. The passage 12p is configured to be opened or closed by a gate valve 12g. The gate valve 12g is provided along the side wall of the chamber body 12.

A support 13 is provided on the bottom of the chamber body 12. The support 13 is made of an insulating material. The support 13 has a substantially cylindrical shape. The support 13 extends upwards from the bottom of the chamber body 12 within the internal space 10s. The support 13 supports a substrate holder 14. The substrate holder 14 is configured to support the substrate W within the chamber 10, that is, within the internal space 10s.

The substrate holder 14 has a lower electrode 18 and an electrostatic chuck 20. The lower electrode 18 and the electrostatic chuck 20 are provided within the chamber 10. The substrate holder 14 may further include an electrode plate 16. The electrode plate 16 is made of, for example, conductor such as aluminum, and has substantially a disc shape. The lower electrode 18 is provided on the electrode plate 16. The lower electrode 18 is made of, for example, conductor such as aluminum, and has substantially a disc shape. The lower electrode 18 is electrically connected to the electrode plate 16.

The electrostatic chuck 20 is provided on the lower electrode 18. The substrate W is placed on the top surface of the electrostatic chuck 20. The electrostatic chuck 20 has a main body and an electrode. The main body of the electrostatic chuck 20 is made of dielectric. The electrode of the electrostatic chuck 20 is a film-shaped electrode and is provided within the main body of the electrostatic chuck 20. The electrode of the electrostatic chuck 20 is connected to a DC power supply 20p via a switch 20s. When a voltage is applied from the DC power supply 20p to the electrode of the electrostatic chuck 20, electrostatic attraction is generated between the electrostatic chuck 20 and the substrate W. Due to the generated electrostatic attraction, the substrate W is attracted to the electrostatic chuck 20 and is held by the electrostatic chuck 20.

A focus ring FR is disposed on the substrate holder 14. The focus ring FR may be made of silicon, silicon carbide, or quartz, but the present disclosure is not limited thereto. When the substrate W is processed within the chamber 10, the substrate W is disposed on the electrostatic chuck 20 within a region surrounded by the focus ring FR.

A flow path 18f is provided inside the lower electrode 18. A heat exchange medium (for example, coolant) is supplied to the flow path 18f through a pipe 22a from a chiller unit 22. The chiller unit 22 is provided outside the chamber 10. The heat exchange medium supplied to the flow path 18f is returned to the chiller unit 22 through a pipe 22b. In the plasma processing apparatus 1, the temperature of the substrate W placed on the electrostatic chuck 20 is adjusted by heat exchange between the heat exchange medium and the lower electrode 18.

The plasma processing apparatus 1 may further include a gas supply line 24. The gas supply line 24 supplies a heat transfer gas (for example, He gas) to a gap between the top surface of the electrostatic chuck 20 and the back surface of the substrate W. The heat transfer gas is supplied from a heat transfer gas supply mechanism to the gas supply line 24.

The plasma processing apparatus 1 further includes an upper electrode 30. The upper electrode 30 is provided above the substrate holder 14. The upper electrode 30 is supported on the upper portion of the chamber body 12 via a member 32. The member 32 is made of an insulating material. The upper electrode 30 and the member 32 close an upper opening of the chamber body 12.

The upper electrode 30 may include a top plate 34 and a support 36. The bottom surface of the top plate 34 is a bottom surface on the internal space 10s side, and defines the internal space 10s. The top plate 34 is made of a silicon-containing material. The top plate 34 is made of, for example, silicon or silicon carbide. A plurality of gas discharge holes 34a is formed in the top plate 34. The gas discharge holes 34a pass through the top plate 34 in the plate thickness direction.

The support 36 detachably supports the top plate 34. The support 36 is made of a conductive material such as aluminum. A gas diffusion chamber 36a is provided inside the support 36. A plurality of gas holes 36b is formed in the support 36. The gas holes 36b extend downwards from the gas diffusion chamber 36a. The gas holes 36b communicate with the gas discharge holes 34a, respectively. A gas introducing port 36c is formed in the support 36. The gas introducing port 36c is connected to the gas diffusion chamber 36a. A gas supply pipe 38 is connected to the gas introducing port 36c.

A gas source group 40 is connected to the gas supply pipe 38 via a valve group 41, a flow rate controller group 42 and a valve group 43. The gas source group 40, the valve group 41, the flow rate controller group 42, and the valve group 43 constitute a gas supply GS. The gas source group 40 includes a plurality of gas sources. The plurality of gas sources in the gas source group 40 includes sources of a plurality of gases used in the method MT. Each of the valve group 41 and the valve group 43 includes a plurality of open/close valves. The flow rate controller group 42 includes a plurality of flow rate controllers. Each of the flow rate controllers in the flow rate controller group 42 is a mass flow controller or a pressure control-type flow rate controller. Each of the gas sources in the gas source group 40 is connected to the gas supply pipe 38 through the corresponding open/close valve of the valve group 41, the corresponding flow rate controller of the flow rate controller group 42, and the corresponding open/close valve of the valve group 43.

In the plasma processing apparatus 1, a shield 46 is detachably provided along the inner wall surface of the chamber body 12. The shield 46 is also provided on the outer periphery of the support 13. The shield 46 prevents a by-product of plasma processing from adhering to the chamber body 12. The shield 46 is configured by forming a corrosion resistant film on the surface of a member made of, for example, aluminum. The corrosion resistant film may be a film made of ceramic such as yttrium oxide.

A baffle plate 48 is provided between the support 13 and the side wall of the chamber body 12. The baffle plate 48 is configured by forming a corrosion resistant film on the surface of a member made of, for example, aluminum. The corrosion resistant film may be a film made of ceramic such as yttrium oxide. A plurality of through holes is formed in the baffle plate 48. An exhaust port 12e is provided below the baffle plate 48 at the bottom of the chamber body 12. An exhaust device 50 is connected to the exhaust port 12e via an exhaust pipe 52. The exhaust device 50 includes a pressure adjusting valve and a vacuum pump such its a turbo molecular pump.

The plasma processing apparatus 1 further includes a first radio-frequency power supply 62 and a second radio-frequency power supply 64. The first radio-frequency power supply 62 is a power supply that generates a first radio-frequency power. As an example, the first radio-frequency power has a frequency suitable for generating plasma. The frequency of the first radio-frequency power is a frequency ranging from, for example, 27 MHz to 100 MHz. As an example, the frequency of the first radio-frequency power may be 60 MHz. The first radio-frequency power supply 62 is connected to the upper electrode 30 via a matching unit 66 the matching unit 66 has a circuit that matches the output impedance of the first radio-frequency power supply 62 to the load-side (the upper electrode 30 side) impedance. Further, the first radio-frequency power supply 62 may be connected to the lower electrode 18 via the matching unit 66.

The second radio-frequency power supply 64 is a power supply that generates a second radio-frequency power. The second radio-frequency power has a frequency lower than the frequency of the first radio-frequency power. The second radio-frequency power may be used as a bias radio-frequency power for drawing ions to the substrate W. The frequency of the second radio-frequency power is a frequency ranging from, for example, 400 kHz to 40 MHz. As an example, the frequency of the second radio-frequency power may be 40 MHz. The second radio-frequency power supply 64 is connected to the lower electrode 18 via a matching unit 68 and the electrode plate 16. The matching unit 68 has a circuit that matches the output impedance of the second radio-frequency power supply 64 to the load-side (the lower electrode 18 side) impedance. Further, the plasma processing apparatus 1 may include any one of the first radio-frequency power supply 62 and the second radio-frequency power supply 64.

The plasma processing apparatus 1 further includes a controller MC. The controller MC may be a computer that includes, for example, a processor, a storage unit such as a memory, an input device, a display device, and an input/output interface for signals. The controller MC controls each unit of the plasma processing apparatus 1. In the controller MC, an operator may perform, for example, a command input operation by using the input device in order to manage the plasma processing apparatus 1. In the controller MC, an operating status of the plasma processing apparatus 1 may be visually displayed by the display device. The storage unit of the controller MC stores a control program and recipe data. The control program is executed by the processor of the controller MC such that various processings may be performed in the plasma processing apparatus 1. When the processor of the controller MC executes the control program, and controls each unit of the plasma processing apparatus 1 according to the recipe data, the method MT is performed in the plasma processing apparatus 1.

Referring back to FIG. 1, the method MT will be described in detail. In the following description, the method MT will be described by using a case where the method MT is applied to the substrate W by using the plasma processing apparatus 1, as an example. In the following description, reference is made to FIG. 4A, FIG. 4B, FIG. 4C, and FIG. 4D as well as FIG. 1. FIG. 4A, FIG. 4B, FIG. 4C, and FIG. 4D are sectional views of a part of the substrate as an example, in an enlarged scale, in a state after the execution of step ST1, a state after the execution of step ST21, a state after the execution of step ST22, and a state after the execution of the method MT, respectively.

As illustrated in FIG. 1, the method MT includes the step ST1 and the step ST2. In the embodiment, the method MT is performed in a state where the substrate W is held by the electrostatic chuck 20 within the chamber 10.

Figure 4A:
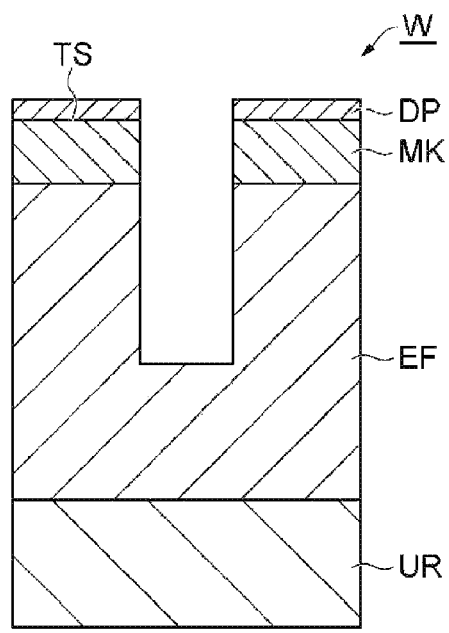
FIG. 4A, FIG. 4B, FIG. 4C, and FIG. 4D are sectional views of a part of the substrate as an example, in an enlarged scale, in a state after the execution of step ST1, a state after the execution of step ST21, a state after the execution of step ST22, and a state after the execution of the method MT, respectively.

In the step ST1, as illustrated in FIG. 4A, a deposit DP is selectively formed on a top surface TS of the mask MK. In the step ST1, formation of the deposit on the side surface of the mask MK and the surface of the film EF exposed from the mask MK is substantially suppressed. For example, in the step ST1, when the aspect ratio of an opening is 1 or more, the deposit is not formed on the surface of the film EF (the surface of the film EF that defines the bottom of the opening). Here, the opening is an opening continuous from an opening of the mask MK or the mask MK to the inside of the film EF. As an example, (the thickness of the deposit DP)/(the width of the opening) may be 1 or more and 2 or less. In the step ST1, the deposit DP may be formed by a plasma processing using a raw material gas. In the embodiment, the deposit DP may be formed by a plasma processing using a mixed gas containing a raw material gas.

In the step ST1 in the embodiment, as for the raw material gas, a carbon-containing gas, for example, a hydrocarbon gas is used. In the step ST1 in the embodiment, plasma of a mixed gas containing the carbon-containing gas and an adjusting gas is formed within the chamber 10. The hydrocarbon gas is, for example, $CH_4$ gas. The adjusting gas is a gas that adjusts the amount of the deposit DP. As an example, the adjusting gas is a nitrogen-containing gas. The nitrogen-containing gas is, for example, a nitrogen gas ($N_2$ gas) or $NH_3$ gas. In this embodiment, carbon-containing chemical species included in the plasma of the mixed gas are selectively deposited on the top surface TS of the mask MK to form the deposit DP.

In the step ST1 in another embodiment, as for the raw material gas, a silicon-containing gas is used. In the step ST1 in the embodiment, plasma of a mixed gas containing the silicon-containing gas and an adjusting gas is formed within the chamber 10. The silicon-containing gas is, for example, an aminosilane gas. The adjusting gas is a gas that adjusts the thickness of the deposit DP to be formed. The adjusting gas contains a rare gas or a nitrogen-containing gas. The rare gas is, for example, an argon gas or a helium gas. The nitrogen-containing gas is, for example, a nitrogen gas ($N_2$ gas) or $NH_3$ gas. The adjusting gas may further contain a halogen-based gas (a gas containing a halogen element). In this embodiment, silicon-containing chemical species included in the plasma of the mixed gas are selectively deposited on the top surface TS of the mask MK to form the deposit DP. In the step ST1 in this embodiment, the deposit DP may contain, for example, silicon, oxygen, and carbon. The deposit DP are made of for example, SiOC. In this embodiment, the film EF is, for example, a silicon nitride film or a silicon carbide film.

In order to execute the step ST1, the controller MC controls the gas supply GS to supply the mixed gas into the chamber 10. The controller MC controls the exhaust device 50 to set the pressure within the chamber 10 to a predetermined pressure. The controller MC controls the first radio-frequency power supply 62 and/or the second radio-frequency power supply 64 to supply the first radio-frequency power and/or the second radio-frequency power. In the step ST1, only the second radio-frequency power out of the first radio-frequency power and the second radio-frequency power may be supplied.

Figure 5:
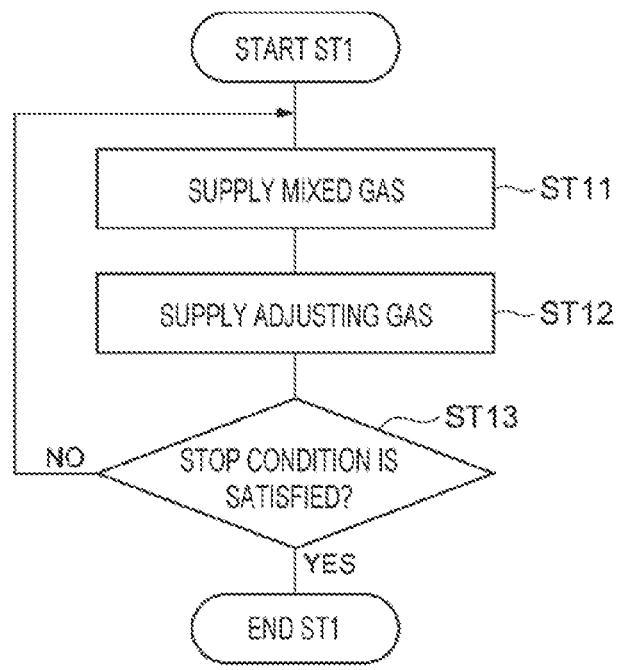
FIG. 5 is a flow chart of the step ST1 in the method according to the embodiment.
Figure 6:
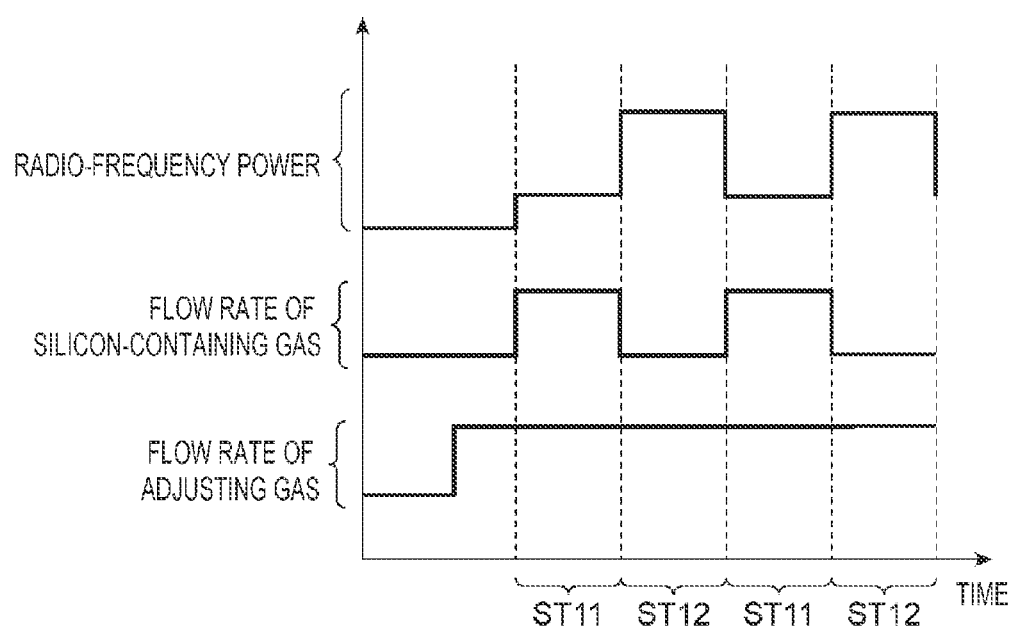
FIG. 6 is a timing chart as an example related to the step ST1 illustrated in FIG. 5.

Hereinafter, reference is made to FIG. 5 and FIG. 6. FIG. 5 is a flow chart of the step ST1 in the method according to the embodiment. FIG. 6 is a timing chart as an example related to the step ST1 illustrated in FIG. 5. In FIG. 6, the horizontal axis indicates time. In FIG. 6, the vertical axis indicates a radio-frequency power, a flow rate of a silicon-containing gas, find a flow rate of an adjusting gas.

In the step ST1 in the embodiment, step ST11 and step ST12 are alternately repeated. In the step ST1, step ST13 is executed so as to determine whether a stop condition is satisfied. The stop condition is satisfied when the number of repetitions of the step ST11 and the step ST12 reaches a predetermined number of times. In the step ST13, when it is determined that the stop condition is not satisfied, the step ST11 and the step ST12 are executed again. Meanwhile, in the step ST13, when it is determined that the stop condition is satisfied, the step ST1 is ended.

In the step ST11, a mixed gas is supplied into the chamber 10. The mixed gas contains a silicon-containing gas and an adjusting gas. In the step ST12, the adjusting gas is supplied into the chamber 10. During execution of the step ST12, supplying of the silicon-containing gas into the chamber 10 is stopped. The silicon-containing gas is, for example, an aminosilane gas. The adjusting gas is a gas that adjusts the thickness of the deposit DP to be formed. The adjusting gas contains a rare gas or a nitrogen-containing gas. The rare gas is, for example, an argon gas or a helium gas. The nitrogen-containing gas is, for example, a nitrogen gas ($N_2$ gas) or $NH_3$ gas. The adjusting gas may further contain a halogen-based gas (a gas containing a halogen element). During execution of the step ST11, plasma of the mixed gas is generated within the chamber 10. In the step ST11, chemical species generated by dissociation of the silicon-containing gas are deposited on the top surface TS of the mask MK. During execution of the step ST12, plasma of the adjusting gas is generated within the chamber 10. In the step ST12, the chemical species extending on the top surface TS of the mask MK react with ions from the plasma of the adjusting gas (for example, the nitrogen-containing gas). As a result, the deposit DP are formed.

The power level of the radio-frequency power in the step ST11 may be lower than the power level of the radio-frequency power in the step ST12. In the step ST11 and the step ST12, both or one of the first radio-frequency power and the second radio-frequency power are/is used as the radio-frequency power. In the embodiment, only the first radio-frequency power is used as the radio-frequency power. The power level of the radio-frequency power in the step ST11 may be substantially equal to the power level of the radio-frequency power in the step ST12.

In order to execute the step ST11, the controller MC controls the gas supply GS to supply the mixed gas into the chamber 10. In order to execute the step ST11, the controller MC controls the exhaust device 50 to set the pressure within the chamber 10 to a predetermined pressure. In order to execute the step ST11, the controller MC controls the first radio-frequency power supply 62 and/or the second radio-frequency power supply 64 to supply the first radio-frequency power and/or the second radio-frequency power.

In order to execute the step ST12, the controller MC controls the gas supply GS to supply the adjusting gas into the chamber 10. In order to execute the step ST12, the controller MC controls the exhaust device 50 to set the pressure within the chamber 10 to a predetermined pressure. In order to execute the step ST12, the controller MC controls the first radio-frequency power supply 62 and/or the second radio-frequency power supply 64 to supply the first radio-frequency power and/or the second radio-frequency power.

Figure 7:
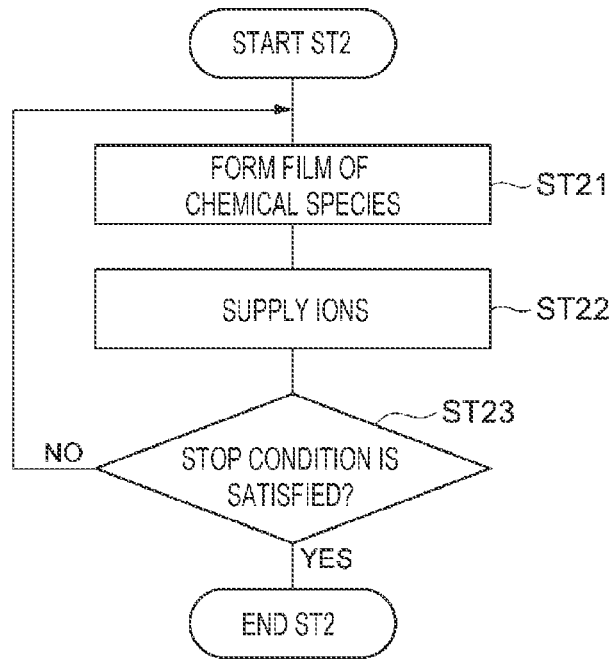
FIG. 7 is a flow chart of step ST2 in an example.

Referring back to FIG. 1, in the method MT, subsequently, the step ST2 is executed. In step ST2, the film EF is etched. FIG. 7 is a flow chart of the step ST2 in an example. As illustrated in FIG. 7, in the embodiment, the step ST2 includes the step ST21 and the step ST22.

In the step ST2, the step ST21 and the step ST22 may be alternately repeated. In this case, in the step ST2, step ST23 is executed so as to determine whether a stop condition is satisfied. The stop condition is satisfied when the number of repetitions of the step ST21 and the step ST22 reaches a predetermined number of times. In the step ST23, when it is determined that the stop condition is not satisfied, the step ST21 and the step ST22 are executed again. Meanwhile, in the step ST23, when it is determined that the stop condition is satisfied, the step ST2 is ended.

Figure 4B:
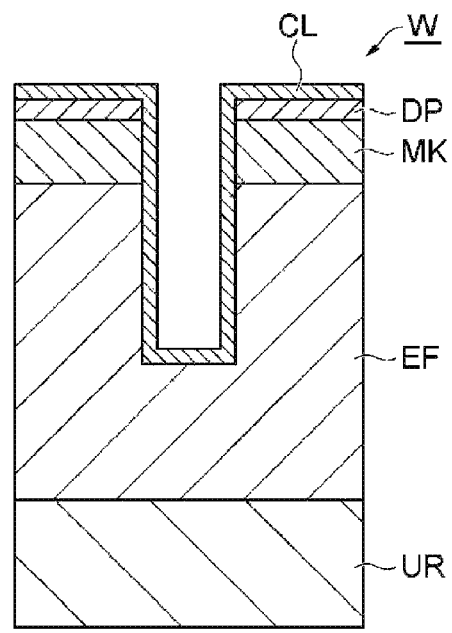
Figure 4C:
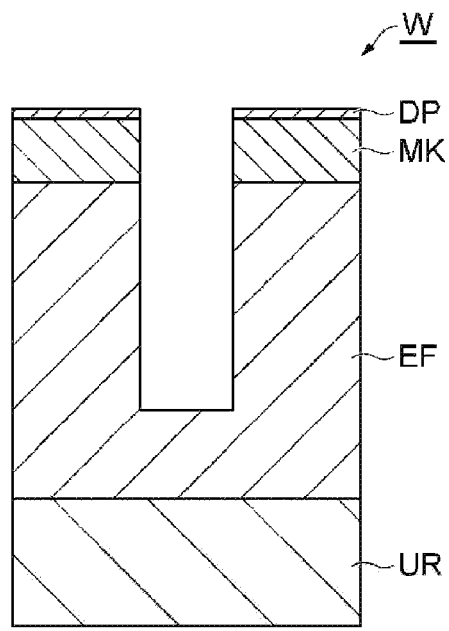

In the step ST21, a layer CL of chemical species included in plasma of a processing gas is formed on the substrate W (see FIG. 4B). In the embodiment, the film EF is a silicon-containing film. The film EF is, for example, a silicon oxide film. In this embodiment, the processing gas used in the step ST21 contains a halogen element and carbon. The processing gas contains, for example, a fluorocarbon gas. The processing gas may contain an oxygen-containing gas and/or a rare gas. In the step ST21, chemical species (for example, fluorocarbon) from the plasma of the processing gas are deposited on the substrate W to form the layer CL.

In the step ST22, ions are supplied from plasma of an inert gas to the substrate W so that the chemical species within the layer CL react with a constituent material of the film EF. The inert gas may be a rare gas such as an argon gas. When ions are supplied from the plasma of the inert gas to the layer CL, a reaction between the chemical species within the layer CL and the constituent material of the film EF is facilitated, and a reaction product is exhausted. As a result, the film EF is etched (see FIG. 4C).

In order to execute the step ST21, the controller MC controls the gas supply GS to supply the processing gas into the chamber 10. In order to execute the step ST21, the controller MC controls the exhaust device 50 to set the pressure within the chamber 10 to a predetermined pressure. In order to execute the step ST21, the controller MC controls the first radio-frequency power supply 62 and/or the second radio-frequency power supply 64 to supply the first radio-frequency power and/or the second radio-frequency power.

In order to execute the step ST22, the controller MC controls the gas supply GS to supply the inert gas into the chamber 10. In order to execute the step ST22, the controller MC controls the exhaust device 50 to set the pressure within the chamber 10 to a predetermined pressure. In order to execute the step ST22, the controller MC controls the first radio-frequency power supply 62 and/or the second radio-frequency power supply 64 to supply the first radio-frequency power and/or the second radio-frequency power.

Figure 4D:
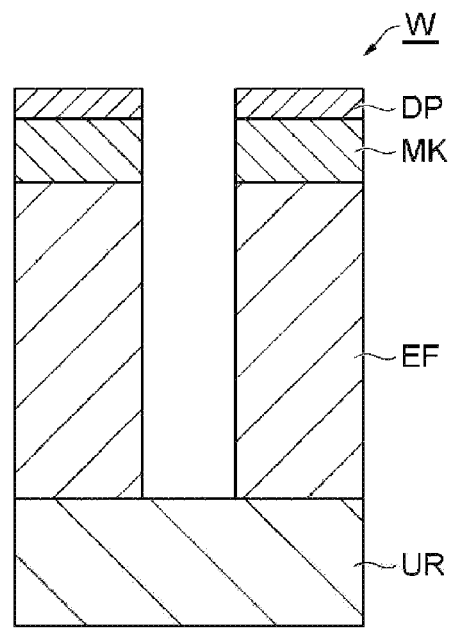

As illustrated in FIG. 1, the step ST1 and the step ST2 may be alternately repeated. In this case, the method MT further includes step ST3 as illustrated in FIG. 1. In the step ST3, it is determined whether a stop condition is satisfied. The stop condition is satisfied when the number of repetitions of the step ST1 and the step ST2 reaches a predetermined number of times. In the step ST3, when it is determined that the stop condition is not satisfied, the step ST1 and the step ST2 are executed again. Meanwhile, in the step ST3, when it is determined that the stop condition is satisfied, the method MT is ended. When the method MT is ended, as illustrated in FIG. 4D, the film EF may be placed in a state where etching has been performed until the base region UR is exposed.

According to the method MT, due to the deposit DP selectively formed on the top surface TS of the mask MK, the mask MK is protected during etching of the film EF. Therefore, the film thickness of the mask MK is suppressed from being decreased due to etching of the film EF. Since the deposit DP are selectively formed on the top surface TS of the mask MK, the etching efficiency of the film EF is suppressed from being lowered due to the deposit DP.

Figure 8:
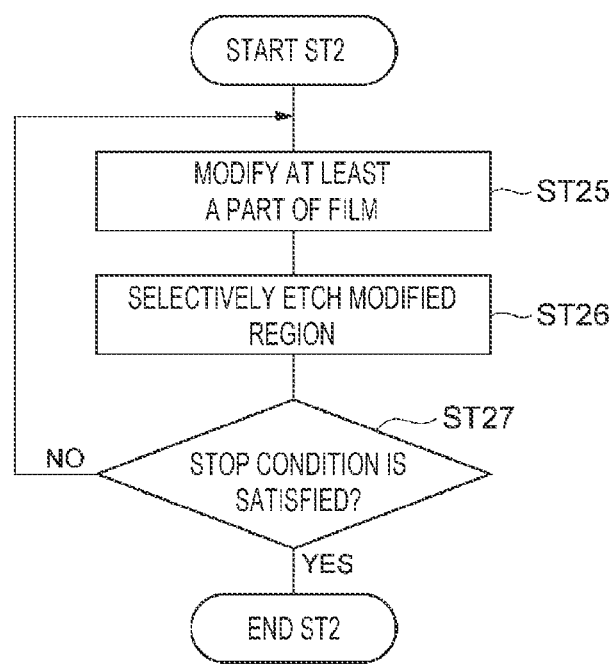
FIG. 8 is a flow chart of the step ST2 in another example.

Hereinafter, reference is made to FIG. 8, FIG. 9A, FIG. 9B, FIG. 9C, and FIG. 9D. FIG. 8 is a flow chart of the step ST2 in another example. FIG. 9A, FIG. 9B, FIG. 9C, and FIG. 9D are sectional views of a part of the substrate as an example, in an enlarged scale, in a state after the execution of the step ST1, a state after the execution of step ST25, a state after the execution of step ST26, and a state after the execution of the method MT, respectively.

In another embodiment, the step ST2 of the method MT may include the step ST25 and the step ST26 as illustrated in FIG. 8. The step ST25 and the step ST26 may be alternately repeated. In this case, in the step ST2, step ST27 is executed so as to determine whether a stop condition is satisfied. The stop condition is satisfied when the number of repetitions of the step ST25 and the step ST26 reaches a predetermined number of times. In the step ST27, when it is determined that the stop condition is not satisfied, the step ST25 and the step ST26 are executed again. Meanwhile, in the step ST27, when it is determined that the stop condition is satisfied, the step ST2 is ended.

In the method MT including the step ST2 illustrated in FIG. 8, the film EF may be a silicon nitride film or a silicon carbide film. In the method MT including the step ST2 illustrated in FIG. 8, the deposit DP is also similarly formed on the film EF in the step ST1 (see FIG. 9A).

In the step ST25, at least a part of the film EF is modified by ions from plasma of a first processing gas. At least a part of the film EF includes an exposed surface of the film EF. Through the step ST25, a modified region MR is formed from at least a part of the film EF (see FIG. 9B).

When the film EF is a silicon nitride film, the first processing gas may contain a hydrogen-containing gas. The hydrogen-containing gas is, for example, a hydrogen gas ($H_2$ gas). When the film EF is a silicon carbide film, the first processing gas may contain a nitrogen-containing gas. The nitrogen-containing gas is, for example, a nitrogen gas ($N_2$ gas) or $NH_3$ gas. In the step ST25, in order to cause ions to enter the inside of the film EF, the second radio-frequency power as well as the first radio-frequency power is used, and the ions are drawn to the film EF.

In the step ST26, the modified region MR is selectively etched by chemical species from plasma of a second processing gas. When the film EF is the silicon nitride film and when the film EF is the silicon carbide film, the second processing gas contains a fluorine-containing gas and a hydrogen gas ($H_2$ gas). The fluorine-containing gas is, for example, $NF_3$ gas. Another fluorine-containing gas may be used. Due to the chemical species from the plasma of the second processing gas, etching of the deposit DP is suppressed, and the modified region MR is selectively etched.

In order to execute the step ST25, the controller MC controls the gas supply GS to supply the first processing gas into the chamber 10. In order to execute the step ST25, the controller MC controls the exhaust device 50 to set the pressure within the chamber 10 to a predetermined pressure. In order to execute the step ST25, the controller MC controls the first radio-frequency power supply 62 and the second radio-frequency power supply 64 to supply the first radio-frequency power and the second radio-frequency power.

In order to execute the step ST26, the controller MC controls the gas supply GS to supply the second processing gas into the chamber 10. In order to execute the step ST26, the controller MC controls the exhaust device 50 to set the pressure within the chamber 10 to a predetermined pressure. In order to execute the step ST26, the controller MC controls the first radio-frequency power supply 62 and/or the second radio-frequency power supply 64 to supply the first radio-frequency power and/or the second radio-frequency power.

Figure 9A:
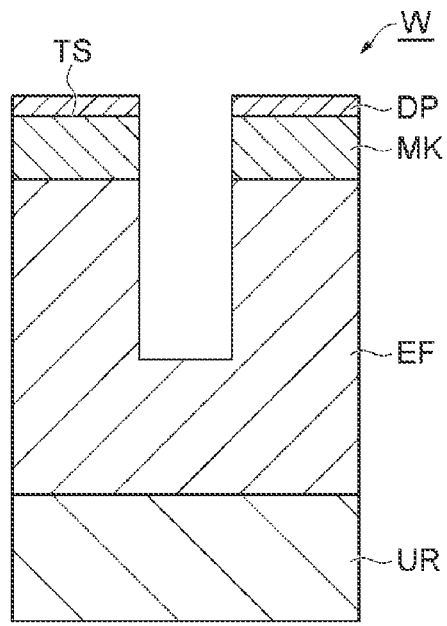
FIG. 9A, FIG. 9B, FIG. 9C and FIG. 9D are sectional views of a part of the substrate as an example, in an enlarged scale, in a state after the execution of the step ST1, a state after the execution of step ST25, a state after the execution of step ST26, and a state after the execution of the method MT, respectively.
Figure 9B:
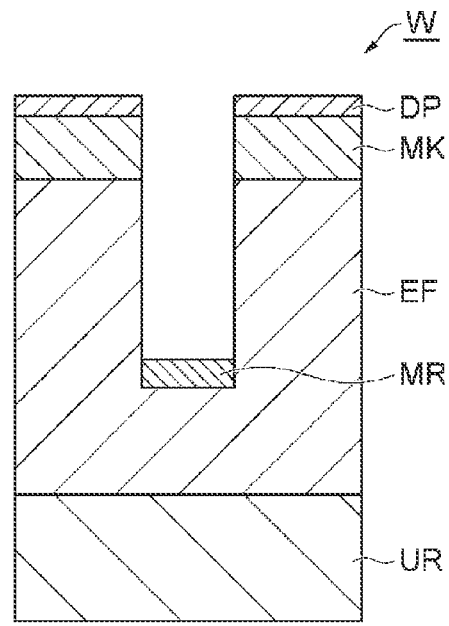
Figure 9C:
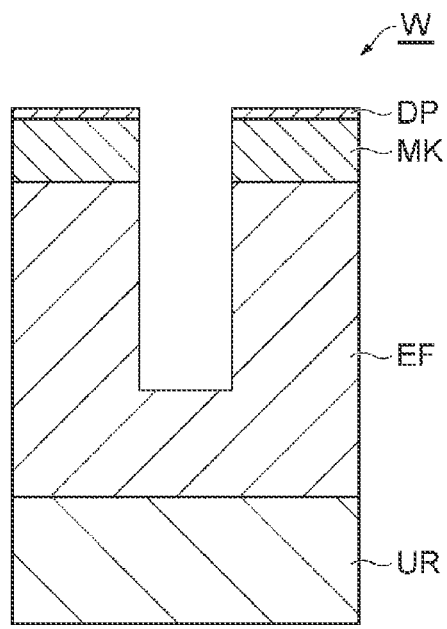
Figure 9D:
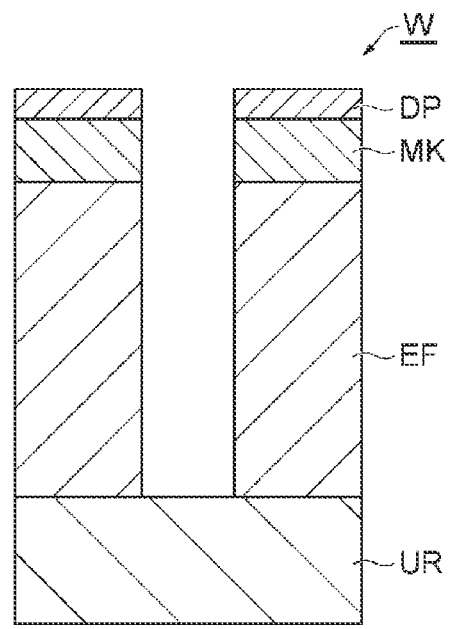

When this method MT is ended, as illustrated in FIG. 9D, the film EF may be placed in a state where etching has been performed until the base region UR is exposed.

Figure 10:
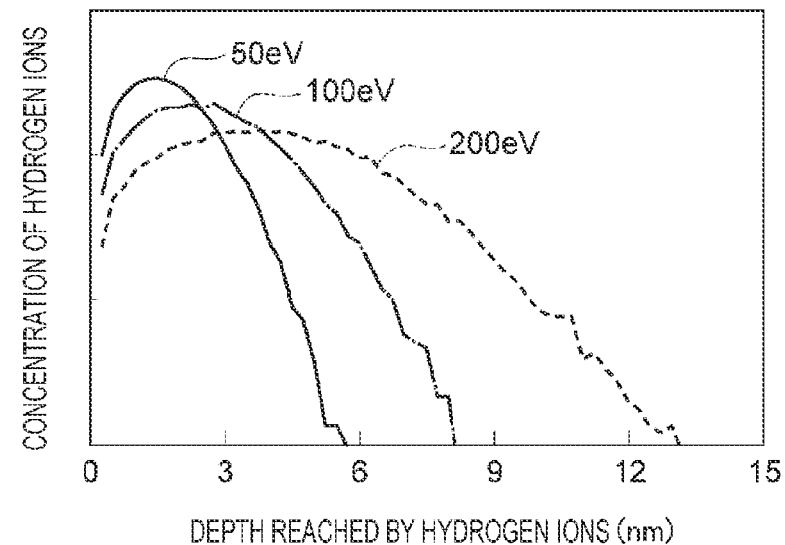
FIG. 10 is a graph illustrating a calculation result of the depth from the surface, which is reached by hydrogen ions within a film.

In the step ST1 in the embodiment, the thickness of the deposit DP may be set such that the ions from the plasma of the first processing gas do not reach the mask MK through the deposit DP. The thickness of the deposit DP may be controlled by adjusting the processing time of the step ST1 and/or the power level of the radio-frequency power used in the step ST1. Here, reference is made to FIG. 10. FIG. 10 is a graph illustrating a calculation result of the depth from the surface, which is reached by hydrogen ions within a film. In FIG. 10, the horizontal axis indicates the depth from the surface, which is reached by the hydrogen ions within the film, and the vertical axis indicates the concentration of the hydrogen ions. As illustrated in FIG. 10, as the energy of the hydrogen ions increases, the depth to which the hydrogen ions enter the inside of the film increases. Therefore, by setting, in advance, the thickness of the deposit DP to be formed in the step ST1 according to the energy of ions to be supplied to the substrate W in the step ST2, it is possible to suppress the ions from reaching the mask MK through the deposit DP in the step ST2.

Figure 11:
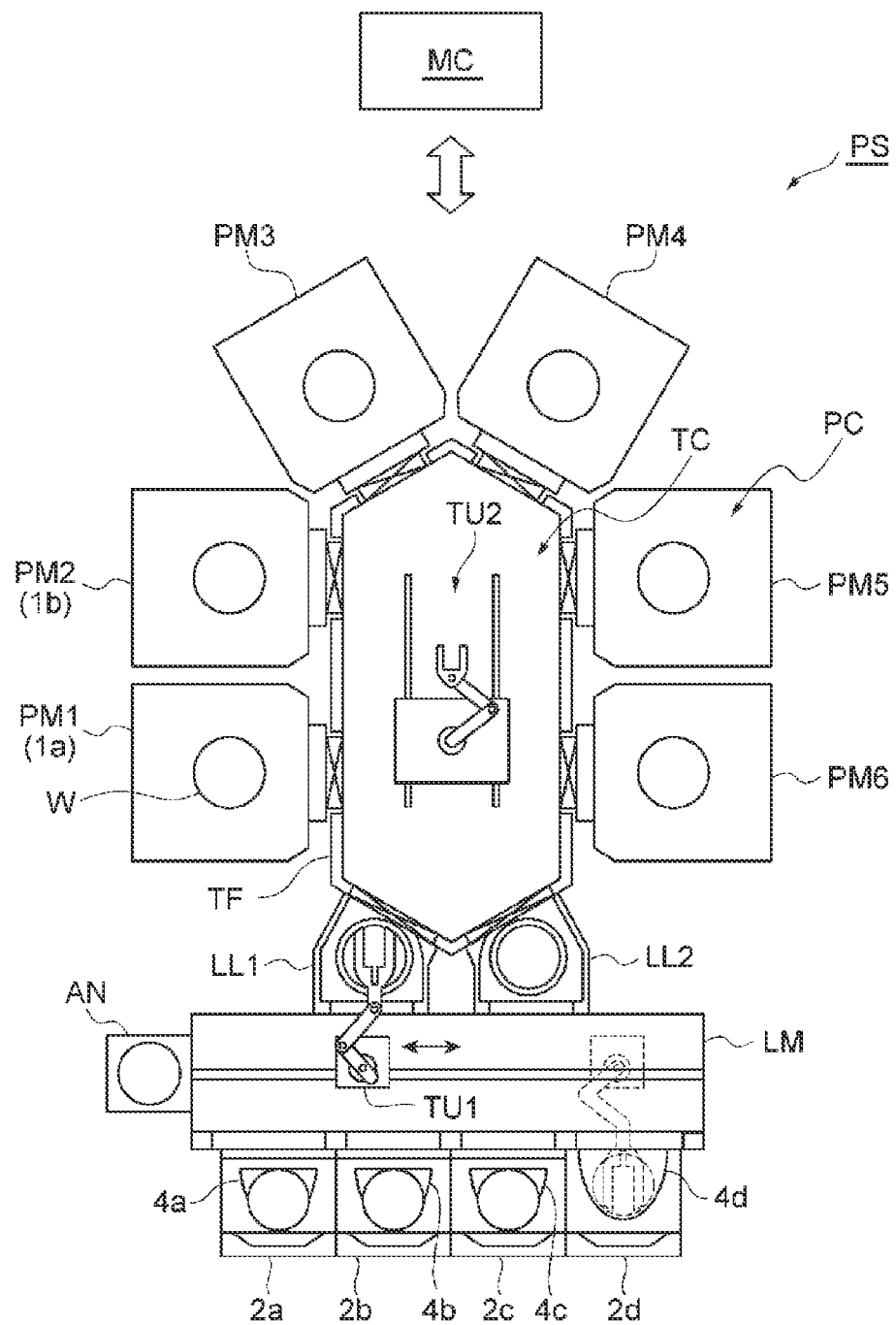
FIG. 11 is a view schematically illustrating a processing system as an example which may be used for executing the method illustrated in FIG. 1.

Hereinafter, reference is made to FIG. 11. FIG. 11 is a view schematically illustrating a processing system as an example which may be used for executing the method illustrated in FIG. 1. In the embodiment, a plasma processing apparatus (hereinafter, referred to as "a first plasma processing apparatus 1a") used for executing the step ST1 and a plasma processing apparatus (hereinafter, referred to as "a second plasma processing apparatus 1b") used for executing the step ST2 may be different from each other. These plasma processing apparatuses may be connected to each other via a vacuum transfer system. In order to execute the method MT of this embodiment, the processing system illustrated in FIG. 11 may be used.

A processing system PS illustrated in FIG. 11 includes stages 2a to 2d, containers 4a to 4d, a loader module LM, an aligner AN, load-lock modules LL1 and LL2, process modules PM1 to PM6, a transfer module TF, and a controller MC. In the processing system PS, each of the number of stages, the number of containers, and the number of load-lock modules may be an arbitrary number equal to or greater than 2. The number of process modules may be an arbitrary number equal to or greater than 2.

The stages 2a to 2d are arranged along one edge of the loader module LM. The containers 4a to 4d are mounted on the stages 2a to 2d, respectively. Each of the containers 4a to 4d is a container called, for example, a front opening unified pod (FOUP). Each of the containers 4a to 4d is configured to accommodate the substrate W therein.

The loader module LM has a chamber. The pressure within the chamber of the loader module LM is set to atmospheric pressure. A transfer device TU1 is provided within the chamber of the loader module LM. The transfer device TU1 is, for example, a multi-joint robot, and is controlled by the controller MC. The transfer device TU1 is configured to transfer the substrate W between each of the containers 4a to 4d find the aligner AN, between the aligner AN and each of the load-lock modules LL1 and LL2, and between each of the load-lock modules LL1 and LL2 and each of the containers 4a to 4d. The aligner AN is connected to the loader module LM. The aligner AN is configured to adjust (position calibration) the position of the substrate W.

Each of the load-lock modules LL1 and LL2 is provided between the loader module LM and the transfer module TF. Each of the load-lock modules LL1 and LL2 provides a preliminary decompression chamber.

The transfer module TF is connected to the load-lock modules LL1 and LL2 via gate valves. The transfer module TF has a transfer chamber TC that may be decompressed. A transfer device TU2 is provided inside the transfer chamber TC. The transfer device TU2 is, for example, a multi-joint robot, and is controlled by the controller MC. The transfer device TU2 is configured to transfer the substrate W between each of the load-lock modules LL1 and LL2 and each of the process modules PM1 to PM6, and between any two process modules among the process modules PM1 to PM6.

Each of the process modules PM1 to PM6 is a processing apparatus that is configured to perform a dedicated substrate processing. Among the process modules PM1 to PM6, one process module is the first plasma processing apparatus 1a. Among the process modules PM1 to PM6, another process module is the second plasma processing apparatus 1b. In the example illustrated in FIG. 11, the process module PM1 is the first plasma processing apparatus 1a, and the process module PM2 is the second plasma processing apparatus 1b. In the embodiment, each of the first plasma processing apparatus 1a and the second plasma processing apparatus 1b may be the same plasma processing apparatus as the plasma processing apparatus 1.

The above described transfer module TF constitutes a vacuum transfer system. The transfer module TF is configured to transfer the substrate between the first plasma processing apparatus 1a and the second plasma processing apparatus 1b.

In the processing system PS, the controller MC is configured to control each unit of the above processing system PS, for example, the first plasma processing apparatus 1a, the second plasma processing apparatus 1b, and the transfer module TF. The control for each unit of the first plasma processing apparatus 1a, by the controller MC, in execution of the step ST1 is the same as the above described control for each unit of the plasma processing apparatus 1, by the controller MC, in execution of the step ST1. The control for each unit of the second plasma processing apparatus 1b, by the controller MC, in execution of the step ST2 is the same as the above described control for each unit of the plasma processing apparatus 1, by the controller MC, in execution of the step ST2.

After executing the step S1, before executing the step ST2, the controller MC transfers the substrate W from the internal space 10s of the chamber 10 of the first plasma processing apparatus 1a to the internal space 10s of the chamber 10 of the second plasma processing apparatus 1b through the pressure-reduced chamber of the transfer module TF. For the transfer, the controller MC controls the transfer module TF. That is, in the method MT, at least from the start time of the step ST1 to the end time of the step ST2, the substrate W is not exposed to the atmosphere. That is, at least from the start time of the step ST1 to the end time of the step ST2, the substrate W is processed without breaking a vacuum in an environment where the substrate W is disposed.

Various embodiments have been described above, but the present disclosure is not limited to the above described embodiments, and various omissions, substitutions and changes may be made. Also, it is possible to form other embodiments by combining elements in different embodiments.

For example, each of one or more plasma processing apparatuses used for executing the method MT may be any type of plasma processing apparatus. Such a plasma processing apparatus may be an inductively coupled plasma processing apparatus or a plasma processing apparatus that uses surface waves such as microwaves in order to generate plasma. The first plasma processing apparatus 1a and the second plasma processing apparatus 1b may be different types of plasma processing apparatuses.

According to the embodiment, it is possible to suppress a film thickness of the mask from being decreased due to etching of the film.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing apparatus comprising:
at least one process chamber;
an upper electrode having a plurality of gas discharge holes;
a first radio-frequency power supply configured to generate a first radio-frequency power;
a second radio-frequency power supply configured to generate a second radio-frequency power having a frequency lower than a frequency of the first radio-frequency power;
a substrate support positioned in the at least one process chamber, the substrate support configured to receive a substrate including a first silicon-containing film and a second film different from the first silicon-containing film; and
a controller configured to control the processing apparatus to:
form a deposit on a top surface of the second film by a plasma from a mixed gas containing a raw material gas; and
etch the first silicon-containing film,
wherein the etch of the first silicon-containing film further includes:
supplying ions to the substrate from a first plasma from a first processing gas to form a layer of chemical species included in the first plasma, separate from the deposit;
discontinuing supply of the first processing gas and the first plasma; and
after discontinuing supply of the first processing gas, supplying ions from a second plasma from an inert gas, thereby causing the chemical species to react with the first silicon-containing film to etch the first silicon-containing film.

2. A processing apparatus comprising:
at least one process chamber;
an upper electrode having a plurality of gas discharge holes;
a first radio-frequency power supply configured to generate a first radio-frequency power;
a second radio-frequency power supply configured to generate a second radio-frequency power having a frequency lower than a frequency of the first radio-frequency power;
a substrate support positioned in the at least one process chamber, the substrate support configured to receive a substrate including a first silicon-containing film and a second film different from the first silicon-containing film; and
a controller configured to control the processing apparatus to:
form a deposit on a top surface of the second film by a plasma from a mixed gas containing a raw material gas; and
etch the first silicon-containing film,
wherein the etch of the first silicon-containing film further includes:
supplying ions to the substrate from a first plasma from a first processing gas to modify at least a part of the first silicon-containing film, thereby forming a modified region;
discontinuing supply of the first processing gas and the first plasma; and
after discontinuing supply of the first processing gas, selectively etching the modified region by a second plasma.

3. A processing apparatus comprising:
at least one process chamber;
a substrate support positioned in the at least one process chamber, the substrate support configured to receive a substrate having an underlying region, a top surface, and at least one film above the underlying region; and
a controller configured to control the processing apparatus to:
form a deposit on the top surface; and
etch part of the at least one film;
wherein the etch further includes:
supplying ions to the substrate from a first plasma of a first processing gas to form at least one of: (a) a layer separate from the deposit comprising chemical species from the first plasma, or (b) a modified region of the at least one film above the underlying region and separate from the deposit;

discontinuing the first plasma from the first processing gas; and after discontinuing the first plasma, forming a second plasma of a second processing gas including an inert gas to etch the part of the at least one film by at least one of: (c) ions from the second plasma causing chemical species of the layer to react with the part of the at least one film, or (d) etching the modified region of the at least one film by chemical species from the second plasma from the second processing gas.

4. The apparatus of claim 3, wherein after the forming of the deposit, an opening is present with portions of the deposit on each side of the opening, and the controller is further configured to control the apparatus to etch the part of the at least one film etched during the etching through the opening.

5. The apparatus of claim 4, wherein the supply of ions to the substrate from the first plasma forms the modified region at a bottom of the opening, and the controller is further configured to control the apparatus to etch the modified region at the bottom of the opening with the second plasma.

6. The apparatus of claim 5, wherein the controller is further configured to control the apparatus to repeat the supply of ions to the substrate from the first plasma and forming of the second plasma to etch through the part of the at least one film and expose the underlying region.

7. The apparatus of claim 4, wherein the controller is further configured to control the apparatus such that the supply of ions to the substrate from the first plasma comprises forming the layer of chemical species from the first plasma on top of the deposit and on a bottom of the opening.

8. The apparatus of claim 3, wherein the at least one film above the underlying region includes a first silicon-containing material and a second material different from the first silicon-containing material, and wherein the controller is further configured to control the apparatus to etch the first silicon-containing material during the etch of the part of the at least one film.

9. The apparatus of claim 8, wherein the controller is further configured to control the apparatus to form the deposit on the second material.

10. The apparatus of claim 9, wherein the controller is further configured to control the apparatus to form the second material as a mask layer.

11. The apparatus of claim 10, wherein the controller is further configured to control the apparatus to form the layer of chemical species from the first plasma on top of the deposit at a location where the deposit is on top of the mask layer, and to form the layer of chemical species at a bottom of an opening of the mask layer and above the first silicon-containing material.

12. The apparatus of claim 9, wherein after forming of the deposit, an opening is present with portions of the deposit on each side of the opening, and wherein the controller is further configured to control the apparatus to form the modified region at a bottom of the opening as a modified region of the first silicon-containing material with the first plasma, and to etch the modified region through the opening with the second plasma.

* * * * *